United States Patent [19]

Pace

[11] Patent Number: 5,204,562
[45] Date of Patent: Apr. 20, 1993

[54] TURN OFF DELAY REDUCTION CIRCUIT AND METHOD

[75] Inventor: W. David Pace, Tempe, Ariz.

[73] Assignee: Motorola, Inc., Schaumburg, Ill.

[21] Appl. No.: 800,320

[22] Filed: Nov. 29, 1991

[51] Int. Cl.$^5$ .................. H03K 17/687; H03K 3/33
[52] U.S. Cl. .................. 307/571; 307/300; 307/247.1; 307/270; 307/279
[58] Field of Search .................. 307/300, 247.1, 263, 307/270, 279, 571-572

[56] References Cited

U.S. PATENT DOCUMENTS

| | | | |
|---|---|---|---|
| 4,051,588 | 9/1977 | Inukai | 307/247.1 |
| 4,531,068 | 7/1985 | Kraft et al. | 307/247.1 |
| 4,891,532 | 1/1990 | Shekhawat et al. | 307/300 |
| 4,906,867 | 3/1990 | Petty | 307/263 |

*Primary Examiner*—William L. Sikes
*Assistant Examiner*—Margaret Rose Wambach
*Attorney, Agent, or Firm*—Michael D. Bingham

[57] ABSTRACT

A gate driver circuit for switching a MOSFET on and off while reducing the turn off delay of the MOSFET without effecting the turn off slew rate thereof includes a low impedance circuit path between the gate and drain of the MOSFET which is responsive to a control signal for providing discharge of the gate capacitance and a controlled current discharge path for controlling the slew rate of the drain voltage. The low impedance circuit path is automatically disabled once the threshold voltage of the MOSFET is reached and the MOSFET begins to turn off as the drain voltage reaches a predetermined level. As the low impedance circuit path is disabled the controlled current discharge path fixes the slew rate or dv/dt of the drain to source voltage during turn off of the MOSFET.

25 Claims, 3 Drawing Sheets

TURN OFF DELAY REDUCTION CIRCUIT AND METHOD

BACKGROUND OF THE INVENTION

The present invention relates to switching circuits and, more particularly, to a circuit that drives a switching device such as the gate of either an integrated circuit or discrete power MOSFET for reducing the turn off delay of the MOSFET while limiting its gate current to maintain a controlled rise (dv/dt) of the drain voltage.

A myriad of circuit applications can be found in the prior art which utilize a gate driven MOSFET that is switched between conducting and non-conducting operating states. The MOSFET, which may be either a discrete device or an integrated device typically has its drain-source electrodes coupled in series with a load element between a power supply. The MOSFET has its gate driven by a controlled current switching circuit such that the load element is connected to the power supply through the low on-resistance of the MOSFET when the latter is turned on as is well known.

Most, if not all, such circuit applications suffer from a time delay resulting as the MOSFET is turned off to disconnect the load element from the power supply. Turn-off delay is a problem for controlled current gate drive circuits because the gate must be discharged from a relatively high $V_{GS}$ (typically 10 volts) to the threshold $V_{GS}$ (typically 4.0 volts) before the drain voltage begins to rise as the device is turned off. If a constant current is used to control the dv/dt voltage rise at the drain of the MOSFET, then the time required to slew the gate from 10 volts to 4 volts is excessive. Previous attempts to reduce the delay have used rapid discharge circuits that discharge the gate to a predetermined voltage. These discharge circuits must initially conduct relatively high currents but stop conducting when the gate reaches the threshold voltage. However, the threshold voltage of a given MOSFET varies in production of such applications with the load element, temperature and FET $V_T$, hence, it is impossible to design a common discharge circuit of the aforementioned type that works well under all conditions.

Thus, a need exists for providing a circuit and method for overcoming the problems of prior art circuits and to reduce the turn-off delay time required in circuit applications utilizing MOSFET switched devices while controlling the dv/dt rise at the drain thereof.

SUMMARY OF THE INVENTION

In accordance with the above there is provided a driver circuit and method for driving the gate of an MOSFET which is responsive to an applied input control signal for turning on and off a MOSFET and which reduces the turn off delay of the MOSFET without effecting the rise time of the drain voltage, comprising a current boost circuit responsive to the control signal for providing a low impedance path between the gate and drain of the MOSFET to rapidly discharge the gate capacitance and which is automatically disabled when the drain voltage exceeds a predetermined value and a controlled current supply coupled to the gate which is responsive to the control signal for providing a predetermined current to turn off the MOSFET at a controlled rate once the current boost circuit is disabled.

DETAILED DESCRIPTION OF THE PREFERRED EMBODIMENT

Figure 1:
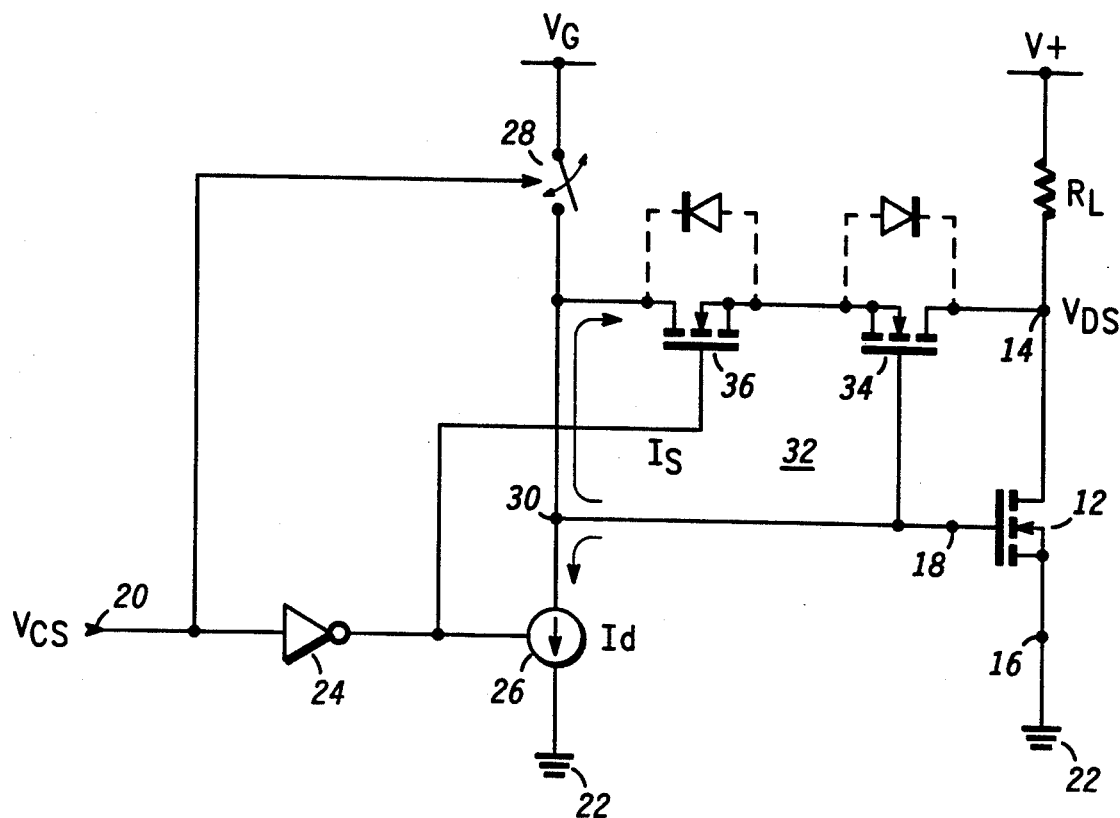
FIG. 1 is a simplified schematic diagram illustrating a driver circuit of the preferred embodiment.

Turning to FIG. 1 there is illustrated integrated driver circuit 10 of one embodiment of the present invention that reduces the turn off delay of MOSFET switching transistor 12. MOSFET 12 has its drain and source coupled in series with load element $R_L$ between V+ and ground 22 at terminals 14 and 16 respectively. It is understood that N-channel MOSFET 12 can either be a discrete or integrated device. Driver circuit 10 is coupled between the drain and gate of MOSFET 12 at terminals 14 and 18 and, as will be described, is responsive to a control signal, $V_{CS}$, applied at input 20 for switching the MOSFET on and off accordingly while reducing the turn off delay of the MOSFET without effecting the rise time (dv/dt) of the drain voltage, $V_{DS}$. Input 20 is coupled though inverter 24 to control current supply 26 and is also coupled to switching means 28. Controlled current supply 26 is coupled between node 30 and ground 22 with node 30 being coupled to the gate of MOSFET 12 at terminal 18. Switch or switching means 28 is also coupled to node 30 which supplied a gate voltage and current charge path thereto when closed. A current boost circuit 32 is shown coupled between the drain and gate of MOSFET 12 between terminals 14 and 18 which when rendered operative provides a low impedance path therebetween for rapidly discharging the gate capacitance of MOSFET 12. Current boost circuit 32 includes MOSFETs 34 and 36. The drain and source of transistor 34 is coupled in series with the source and drain of transistor 36 between terminal 14 and node 30 respectively while the gate of transistor 34 is coupled to the gate of MOSFET 12 and the gate of transistor 36 is coupled to the output of inverter 24. The respective dashed in diodes are the intrinsic body diodes associated with the respective MOS transistors 34 and 36.

Figure 2:
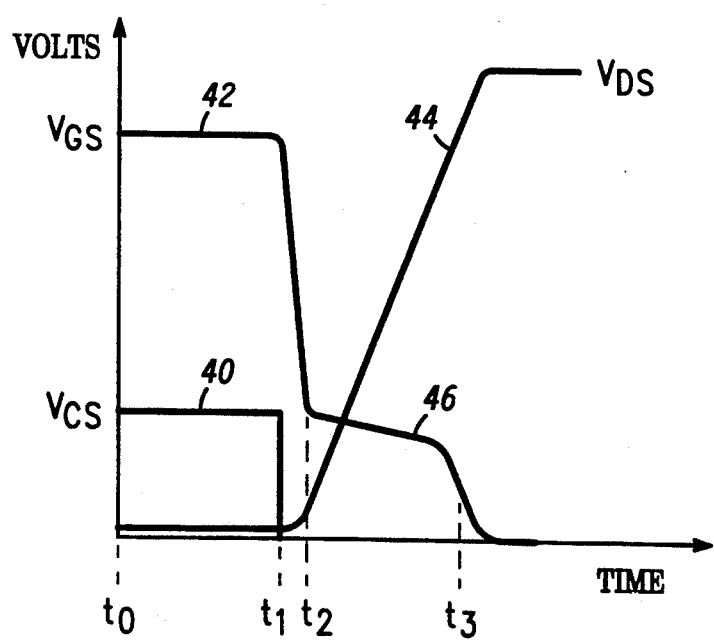
FIG. 2 is a wave form diagram useful for understanding the operation of the driver circuit.

Referring to FIG. 2 the operation of driver circuit 10 is described assuming that steady state switching operation has occurred prior to time $t_0$. Hence, with $V_{CS}$ being in a high level state, wave form 40, switch 28 is closed and MOSFET 12 is turned on as maximum gate voltage, wave form 42, is applied to the gate and, as shown by wave form 44, its drain to source voltage, $V_{DS}$, is at a low potential. In this mode, the on resistance of MOSFET 12 is very low, typically a few ohms, and maximum current flows through $R_L$. Further, the output of inverter 24 is low such that both current supply 26 and circuit 32 are disabled. However, transistor 34 is biased on since its gate is coupled to node 30 whereby the drain voltage appearing at terminal 14 also appears at the source of the transistor while transistor 36 is off.

At $t_1$, control signal, $V_{CS}$, goes to a low level state to initiate turn off of MOSFET 12 and switch 28 opens, thereby disconnecting gate drive to MOSFET 12. Simultaneously, the output of inverter 24 goes high to render both current supply 26 and circuit 32 operative.

Hence, at $t_1$, both transistors 34 and 36 are turned on to provide a low impedance conduction path between the drain and gate of MOSFET 12 since the gates thereof are at a positive potential initially. A high discharge current, $I_S$, relative to Id, flows through transistors 34 and 36 and the drain of MOSFET 12 to rapidly discharge the gate capacitance of the MOSFET while rapidly decreasing $V_{GS}$ to the threshold value. When $V_{GS}$ reaches the threshold value of MOSFET 12, the drain voltage thereof appearing at terminal 14 begins to rise. Thus, the time delay between $t_1$ and $t_2$ is reduced by the low impedance discharge path of circuit 32. Circuit 32 is automatically disabled once the threshold voltage of MOSFET 12 is reached and $V_{DS}$ has reached a potential to reverse bias the body diode associated with transistor 34 thus turning this device off. This results in the discharge path through transistors 34 and 36 being broken allowing current supply 26 to continue discharge of the gate of MOSFET 12 at a controlled rate such that $V_{DS}$ rises at a predetermined slew rate (dv/dt). Note, the flattening (wave form portion 46) of $V_{GS}$ is a natural occurrence due to the well known Miller capacitance effect associate with parasitic capacitance of MOSFET 12.

It is significant to note that if the $V_{GS}$ threshold voltage of MOSFET 12 changes for any reason, current boost or discharge circuit 32 responds properly and is disabled at the proper time whenever the drain voltage of MOSFET 12 begins to increase. Thus, discharge circuit 32 is not susceptable to process variations in MOSFET 12 or temperature or load conditions as are prior art driver circuits. In addition, it is well within the skill of those in the art to recognize that transistors 34 can be replaced with a diode oriented in the same manner as shown by the body diode associated with this transistor.

Figure 3:
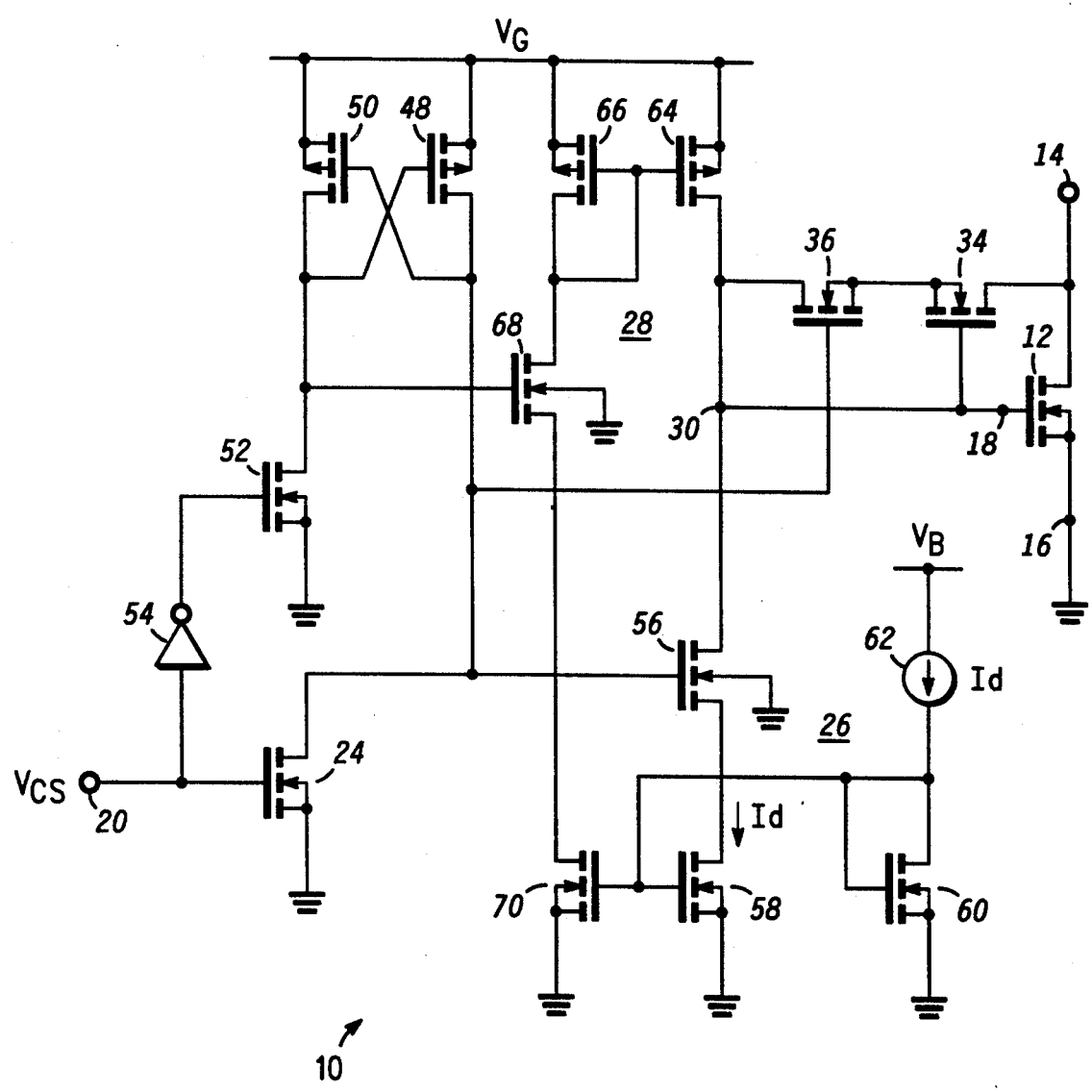
FIG. 3 is a detailed schematic diagram of the driver circuit of FIG. 1.

Turning now to FIG. 3, driver circuit 10 is shown in more detail wherein like components are designated with the same reference numbers as in FIG. 1. In this embodiment inverter 24 is realized by a MOSFET device having its gate connected to input 20, its drain coupled to the gates of MOSFETs 36 and 56 and its source coupled to ground. Controlled current supply 26 includes constant current source 62 which sources current $I_d$ to diode connected MOSFET 60 which biases the gate of MOSFET 58 such that it sinks the current equal to $I_d$ through its drain-source. MOSFET 56 which has its drain-source coupled between node 30 and the drain of MOSFET 58 is turned off whenever $V_{CS}$ is in a high level state and is turned on when $V_{CS}$ is in a low level state as its gate is coupled to the drain of MOSFET device 24.

Switch circuit 28 includes inverter 54 coupled between input 20 and the gate of MOSFET 52 the latter of which has its drain-source conduction path coupled in series with the source-drain conduction path of MOSFET 50 between $V_G$ and ground. The gate of MOSFET 50 is returned to the output of inverter MOSFET 24 the latter of which is also coupled in series with the source-drain conduction path of MOSFET 48 to $V_G$. The gate of MOSFET 48 is coupled both to the drain of MOSFET 52 and the gate of MOSFET 68 whose source is coupled in series with the drain-source of MOSFET 70 to ground. A known current turn around circuit comprising MOSFETs 64 and 66 is coupled between the drain of MOSFET 68 and node 30.

Thus, with $V_{CS}$ in a high level state transistor 50 is turned on while transistor 52 is turned off as their gate electrodes are both pulled low. In this state transistor 48 is turned off while transistor 68 is turned on. Hence, transistor 70, which is biased on by diode connected transistor 60, sinks a current through transistors 68 and 66 which is mirrored through transistor 64 to node 30. MOSFET 12 is therefore turned on by transistor 64. Meanwhile transistors 56 and 36 are maintained in an off state as the drain of inverter MOSFET 24 is low. In response to $V_{CS}$ going to a low level state, the output or drain of inverter MOSFET 24 goes high which enables or turns on transistors 56 and 36. Hence, the controlled current $I_d$ is pulled from node 30 as described above while the current $I_S$ flows through transistors 36 and 34. Simultaneously, transistors 50 and 52 are turned off and on respectively which causes transistor 68 to be turned off. Transistors 66 and 64 are thereby effectively disabled to disconnect node 30 from $V_G$. Therefore, MOSFET 12 is alternately turned on and off as $V_{CS}$ alternates between high and low level states.

Figure 4:
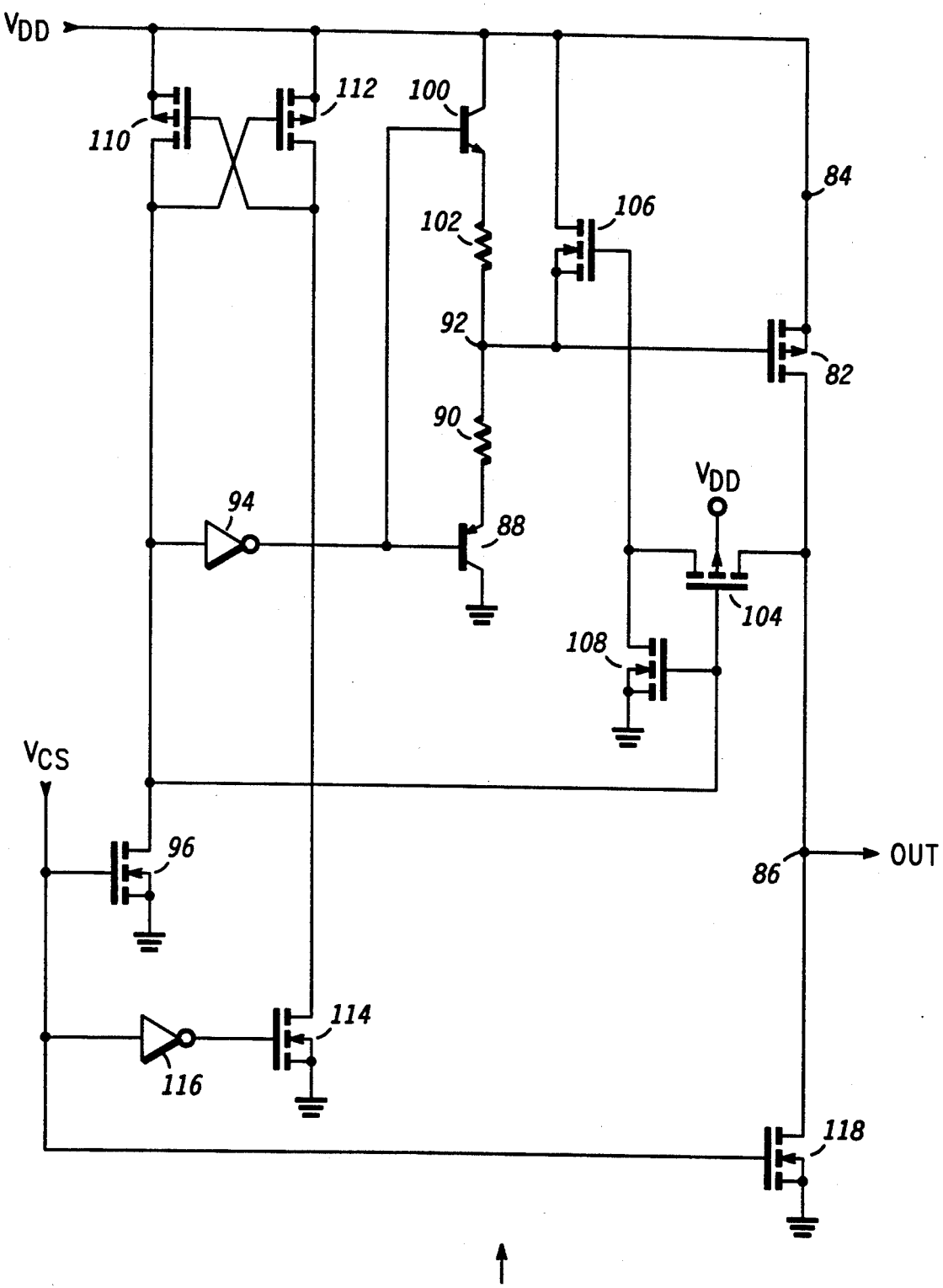
FIG. 4 is a detailed schematic diagram illustrating another embodiment of the present invention.

Turning now to FIG. 4 there is shown driver circuit 80 of another embodiment of the present invention that can drive either MOSFET 82 in a high side driver application or in conjunction with MOSFET 118 can be utilized in a push-pull driver application for sinking and sourcing load current to a load element (not shown) coupled at output 86.

In a high side driver application MOSFET 118 is not required and the driver circuit is utilized to turn MOSFET 82 on and off in accordance with the present invention to source current only to the load connected to output 86. In this application, the current discharge or boost circuit for reducing the turn off delay of MOSFET 82 comprises MOSFETs 104, 106 and 108 as will be described.

Thus, MOSFET 82 is turned on responsive to $V_{CS}$ being in a low level state in the following manner. As $V_{CS}$ is low, the drain of MOSFET 96 will float as this device is turned off. Simultaneously, inverter 116 turns on MOSFET 114 as its gate is placed at a high voltage level. In this state, MOSFET 110 is turned on to drive the input to inverter 94 high which in turn places a low signal at the bases of transistors 88 and 100. Transistor 88 is then turned on, while transistor 100 is turned off, to pull current from node 92 via resistor 90. MOSFET 82 is thus turned on as node 92 is driven to a low voltage state to source current to a load connected at output 86. Concurrently, MOSFET 108 is turned on to maintain MOSFET 106 in a nonconducting state while MOSFET 104 is turned off. Incidentally if MOSFET 118 is used it will be turned off at this time.

Responsive to $V_{CS}$ going high MOSFET 82 will be turned off in the following manner. As $V_{CS}$ goes high, MOSFET inverter 96 is turned on while MOSFET 114 is turned off thereby turning off MOSFET 110. The drain of MOSFET 96 being low turns on MOSFET 104 while MOSFET 108 is turned off. Since the potential at output 86 is high the gate of MOSFET 106 is also high via MOSFET 104. A low impedance path is provided through MOSFET 106 to rapidly discharge the gate capacitance of MOSFET 82 in a similar manner as discussed with respect to FIG. 1. Simultaneously, transistor 100 is rendered conductive as its base is driven high by inverter 94 to source a controlled discharge current to the gate of MOSFET 82 via resistor 102 thereby pulling the gate towards $V_{DD}$. As the drain voltage decreases to a predetermined level after the threshold voltage, $V_{GS}$, of MOSFET 82 is reached MOSFET 106 is turned off via MOSFET 104 thereby disabling the fast discharge circuit and further decrease in the drain voltage is controlled by resistor 102 to a fixed slew rate.

Hence, what has been described above is a novel method and circuit for reducing the turn off delay of a switching MOSFET which circuit includes a fast discharge circuit which is automatically disable wherein the turn off slew rate of the MOSFET is thereafter controlled. The circuit is independent of process and temperature variations.

What is claimed is:

1. A driver circuit for switching a load MOSFET on and off responsive to a control signal applied at an input of the driver circuit while reducing delay time for switching the load MOSFET off, comprising:
   a current supply coupled to a gate of the load MOSFET and being responsive to the control signal being in a first level state for providing a first current of fixed magnitude for switching off the load MOSFET at a controlled rate;
   a current boost circuit coupled between the gate and a drain of the load MOSFET and being responsive to the control signal being in said first level state for providing a second current via a low impedance circuit path to rapidly discharge associated gate capacitance of the load MOSFET during initial switching off of the load MOSFET until a voltage developed at said drain of the load MOSFET reaches a predetermined value after which said current boost circuit is disabled and the load MOSFET is then switched off at a controlled rate by said current supply, said second current having a magnitude greater than the magnitude of said first current, said current boost circuit including a first MOSFET having a drain coupled to said gate of said load MOSFET, a source and a gate to which the control signal is coupled, and diode means coupled between said source of said first MOSFET and said drain of the load MOSFET;
   circuit means coupled to said gate of the load MOSFET and being responsive to the control signal being in a second level state for turning on the load MOSFET; and
   said diode means being a second MOSFET having a source coupled to said source of said first MOSFET, a drain coupled to said drain of the load MOSFET and a gate coupled to said gate of the load MOSFET.

2. The circuit of claim 1 wherein said current supply includes:
   a third MOSFET having a drain coupled to said gate of the load MOSFET, a source and a gate the latter to which the control signal is coupled; and
   a current source coupled to the source of said third MOSFET for providing a said first current.

3. The circuit of claim 2 including an inverter coupled between the input of the circuit and said gate of said third MOSFET.

4. The circuit of claim 3 including switching circuit means coupled between the input of the circuit and said gate of the load MOSFET and being responsive to the control signal being in said second level state for turning on the load MOSFET.

5. The circuit of claim 4 wherein said drain of the load MOSFET is coupled at a terminal to a load for providing current through the load when turned on.

6. A switch driver circuit for switching a load MOSFET coupled thereto on and off responsive to a control signal applied at an input of the circuit while reducing the turn off delay time of the load MOSFET as the load MOSFET is switched off, comprising:
   a current supply coupled to a gate of the load MOSFET and being responsive to the control signal being in a first level state for providing a current for switching off the load MOSFET at a controlled rate;
   current boost circuit means coupled between a gate and a drain of the load MOSFET and being responsive to the control signal being in said first level state for providing additional current to rapidly discharge associated gate capacitance of the load MOSFET to aid in the initial turn off of the load MOSFET until the voltage at the drain reaches a predetermined value after which said drain voltage changes at said controlled rate, said current boost circuit means includes a first MOSFET having a drain coupled to said gate of said load MOSFET, a source, and a gate to which said control signal is coupled and diode means coupled between said source of said first MOSFET and said drain of the load MOSFET;
   switching circuit means responsive to the control signal being in a second level state for turning on the load MOSFET, said switching circuit means having an output coupled to said gate of the load MOSFET; and
   circuit means coupled to said gate of the load MOSFET and being responsive to the control signal being in said second level state for switching on the load MOSFET and said diode means being a second MOSFET having a source coupled to said source of said first MOSFET, a drain coupled to said drain of the load MOSFET and a gate coupled to said gate of the load MOSFET.

7. The circuit of claim 6 wherein said current supply includes:
   a third MOSFET having a drain coupled to said gate of the load MOSFET, a source and a gate the latter to which the control signal is coupled; and
   a current source coupled to the source of said third MOSFET for providing a predetermined current.

8. The circuit of claim 7 including an inverter coupled between the input of the circuit and said gate of said third MOSFET.

9. The circuit of claim 8 including switching circuit means coupled between the input of the circuit and said gate of the load MOSFET and being responsive to the control signal being in a second level state for turning on the load MOSFET.

10. The circuit of claim 9 wherein said drain of the load MOSFET is coupled at a terminal to a load for providing current through the load when turned on.

11. A circuit for switching on and off a load MOSFET coupled thereto responsive to a control signal applied at an input of the circuit while reducing turn off delay time when the load MOSFET is switched off, comprising:
   a current boost circuit coupled between a gate and drain of the load MOSFET and being responsive to the control signal being in a first level state for providing a first current of a predetermined magnitude via a low impedance circuit conductance path to rapidly discharge associated gate capacitance of the load MOSFET thereby initially aiding the switching off of the load MOSFET until a voltage developed at the drain of the load MOSFET reaches a predetermined value after which said current boost circuit is disabled; and a current supply coupled to said gate of the load MOSFET and being responsive to the control signal being in said first level state for providing a second current of a predetermined magnitude for switching off the load MOSFET at a controlled rate after said current boost circuit is disabled, said magnitude of said first current being greater than said magnitude of said second current.

12. The circuit of claim 11 wherein said current boost circuit includes:
   a first MOSFET having a drain coupled to said gate of said load MOSFET, a source and gate to which said control signal is coupled
   a diode means coupled between said source of said first MOSFET and said drain of the load MOSFET.

13. The circuit of claim 11 wherein said current boost circuit includes:
   a first MOSFET having a source coupled to said gate of the load MOSFET, a drain coupled to a first power supply conductor and a gate;
   a second MOSFET having a source coupled to said drain of the load MOSFET, a drain coupled to said gate of said first MOSFET and a gate to which the control signal is coupled; and
   a third MOSFET having a source coupled to a second power supply conductor, a drain coupled to said gate of said first MOSFET and a gate coupled to said gate of said second MOSFET.

14. The circuit of claim 13 wherein said current supply includes a first transistor having an emitter coupled to said gate of the load MOSFET, a collector coupled to said first power supply conductor and a base to which the control signal is coupled.

15. The circuit of claim 14 wherein said current supply includes a first resistor coupled between said emitter of said first transistor and said gate of the load MOSFET.

16. The circuit of claim 15 including switching circuit means having an input to which the control signal is coupled and an output coupled to said gate of the load MOSFET for turning the same on responsive to said control signal being in a second level state.

17. The circuit of claim 16 wherein said drain of the load MOSFET is coupled at a terminal to a load for providing current through the load when turned on.

18. The circuit of claim 17 including a fourth MOSFET having a drain coupled to said drain of the load MOSFET, a source coupled to said second power supply conductor and a gate coupled to the input of the circuit.

19. An integrated circuit for turning a MOSFET coupled thereto on and off responsive to a control signal applied at an input of the circuit while reducing turn off delay time when the MOSFET is turned off responsive to the control signal, comprising:

current boost circuit means coupled between a gate and drain of the MOSFET and being responsive to the control signal being in a first level state for providing a first current of a predetermined magnitude via a low impedance circuit conductance path to rapidly discharge associated gate capacitance of the MOSFET thereby initially aiding the turning off of the load MOSFET until a voltage developed at the drain of the MOSFET reaches a predetermined value after which said current boost circuit means is disabled;

a current supply coupled to said gate of the MOSFET and being responsive to the control signal being in said first level state for providing a second current of a predetermined fixed magnitude for switching off the MOSFET at a controlled rate after said current boost circuit means is disabled, said magnitude of said first current being greater than said magnitude of said second current;

a switching circuit responsive to the control signal being in a second level state for turning on the MOSFET, said switching circuit having an output coupled to said gate of the MOSFET.

20. The circuit of claim 19 wherein said current boost circuit means includes:
   a first MOSFET having a source coupled to said gate of the MOSFET, a drain coupled to a first power supply conductor and a gate;
   a second MOSFET having a source coupled to said drain of the MOSFET, a source coupled to said gate of said first MOSFET and a gate to which the control signal is coupled; and
   a third MOSFET having a source coupled to a second power supply conductor, a drain coupled to said gate of said first MOSFET and a gate coupled to said gate of said second MOSFET.

21. The circuit of claim 20 wherein said current supply includes a first transistor having an emitter coupled to said gate of the MOSFET, a collector coupled to said first power supply conductor and a base to which the control signal is coupled.

22. The circuit of claim 21 wherein said current supply includes a first resistor coupled between said emitter of said first transistor and said gate of the MOSFET.

23. The circuit of claim 22 wherein said drain of the MOSFET is coupled at a terminal to a load for providing current through the load when turned on.

24. The circuit of claim 23 including a fourth MOSFET having a drain coupled to said drain of the MOSFET, a source coupled to said second power supply conductor and a gate coupled to the input of the circuit.

25. The circuit of claim 19 wherein said current boost circuit means includes:
   a first MOSFET having a drain coupled to said gate of said load MOSFET, a source, and a gate to which said control signal is coupled
   a diode coupled between said source of said first MOSFET and said drain of the load MOSFET.

* * * * *